United States Patent
Gao et al.

(10) Patent No.: US 9,047,893 B1
(45) Date of Patent: Jun. 2, 2015

(54) MAGNETIC SENSOR HAVING NARROW TRACKWIDTH AND SMALL READ GAP

(71) Applicant: HGST Netherlands B.V., Amsterdam (NL)

(72) Inventors: Zheng Gao, San Jose, CA (US); Hardayal S. Gill, Palo Alto, CA (US); Ying Hong, Morgan Hill, CA (US); Quang Le, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/170,487

(22) Filed: Jan. 31, 2014

(51) Int. Cl.
G11B 5/39 (2006.01)

(52) U.S. Cl.
CPC . *G11B 5/398* (2013.01); *G11B 5/39* (2013.01)

(58) Field of Classification Search
USPC .................................... 360/319, 324–324.2
See application file for complete search history.

(56) References Cited

U.S. PATENT DOCUMENTS

| | | | |
|---|---|---|---|
| 6,865,062 B2 | 3/2005 | Pinarbasi | |
| 6,893,740 B2 * | 5/2005 | Saito | 428/668 |
| 6,980,406 B2 * | 12/2005 | Gill | 360/324.12 |
| 7,092,220 B2 * | 8/2006 | Gill et al. | 360/324.11 |
| 7,092,221 B2 | 8/2006 | Gill | |
| 7,171,741 B2 * | 2/2007 | Gill | 29/603.14 |
| 7,245,463 B2 * | 7/2007 | Gill | 360/324.12 |
| 7,265,946 B2 * | 9/2007 | Gill | 360/324.11 |
| 7,342,753 B2 * | 3/2008 | Gill | 360/324.12 |
| 7,365,949 B2 * | 4/2008 | Hayakawa et al. | 360/324.1 |
| 7,436,638 B1 * | 10/2008 | Pan | 360/324.11 |
| 7,472,469 B2 | 1/2009 | Heim et al. | |
| 7,522,391 B2 | 4/2009 | Freitag et al. | |
| 7,869,166 B2 * | 1/2011 | Miyauchi et al. | 360/324.11 |
| 7,961,440 B2 | 6/2011 | Gill et al. | |
| 8,068,317 B2 * | 11/2011 | Gill | 360/324.2 |
| 8,305,715 B2 | 11/2012 | Mauri et al. | |
| 8,474,127 B2 * | 7/2013 | Gill et al. | 29/603.13 |
| 8,711,528 B1 * | 4/2014 | Xiao et al. | 360/324.11 |

(Continued)

FOREIGN PATENT DOCUMENTS

| | | | |
|---|---|---|---|
| GB | 2387957 A | * | 10/2003 |
| JP | 2007164831 A | * | 6/2007 |
| JP | 2008153295 A | * | 7/2008 |

OTHER PUBLICATIONS

English-machine translation of JP 2008-153295 A to Kondo, published on Jul. 3, 2008.*

(Continued)

*Primary Examiner* — Will J Klimowicz
(74) *Attorney, Agent, or Firm* — Zilka-Kotab, PC

(57) ABSTRACT

A magnetic sensor having a first sensor stack portion that includes a free layer, non-magnetic spacer or barrier layer and a portion of a pinned layer structure. The sensor has second sensor stack portion formed over the first sensor stack portion. The second sensor stack portion include includes a second portion of the pinned layer structure and a layer of anti-ferromagnetic material formed over the. The first sensor stack portion is configured with a width and stripe height that define the functional width and strip height of the sensor, whereas the upper portion can be made wider and deeper without affecting sensor performance. Because the patterning of the first sensor stack portion is performed on a thinner structure than would be necessary to pattern the entire sensor stack, the patterning can be performed with smaller dimensions and increased resolution.

14 Claims, 25 Drawing Sheets

(56) References Cited

U.S. PATENT DOCUMENTS

| | | |
|---|---|---|
| 8,842,395 B2 * | 9/2014 | Ju et al. ............. 360/324.12 |
| 2009/0168235 A1 * | 7/2009 | Ju et al. ............. 360/110 |
| 2011/0273802 A1 | 11/2011 | Zhou et al. |
| 2012/0276415 A1 | 11/2012 | Sapozhnikov et al. |
| 2012/0320473 A1 | 12/2012 | Okamura et al. |
| 2014/0168822 A1 * | 6/2014 | Le et al. ............. 360/294 |

OTHER PUBLICATIONS

Hoshino, K., et al., "Applying Amorphous CoNbZr Shield to Improve the Dielectric-Breakdown Voltage of the Gap Layers of Narrow-Gap Read Heads," IEEE Transactions on Magnetics, vol. 39, No. 5, Sep. 2003 pp. 2393-2395.

* cited by examiner

MAGNETIC SENSOR HAVING NARROW TRACKWIDTH AND SMALL READ GAP

FIELD OF THE INVENTION

The present invention relates to magnetic data recording and more particularly to a magnetic read sensor having a track-width defined by a bottom deposited free layer structure and having a pinned layer structure deposited over the free layer structure.

BACKGROUND

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft underlayer of the magnetic medium to return to the return pole of the write head.

A magnetoresistive sensor such as a Giant Magnetoresistive (GMR) sensor or a Tunnel Junction Magnetoresisive (TMR) sensor can be employed to read a magnetic signal from the magnetic media. The magnetoresistive sensor has an electrical resistance that changes in response to an external magnetic field. This change in electrical resistance can be detected by processing circuitry in order to read magnetic data from the adjacent magnetic media.

As the need for data density increases there is an ever present need to decrease the gap spacing of the magnetic sensor in order to decrease bit size and thereby increase linear data density. However, the thickness of the sensor layers can only be reduced so much without adversely affecting sensor performance and stability. Therefore, there remains a need for a magnetic sensor design that can provide robust sensor performance while also reducing gap spacing.

SUMMARY

The present invention provides a magnetic sensor that includes a sensor stack having a first portion and a second portion formed over the first portion. The first portion has a width that defines a sensor track-width and the second portion has a width that extends beyond the sensor track-width. The first portion of the sensor stack includes: a magnetic free layer; a non-magnetic layer; and a first portion of a first magnetic pinned layer. The non-magnetic layer is sandwiched between the magnetic free layer and the first portion of the first magnetic pinned layer. The second portion of the sensor stack includes: a second portion of the first magnetic pinned layer; a second magnetic pinned layer; a non-magnetic anti-parallel coupling layer sandwiched between the first magnetic pinned layer and the second magnetic pinned layer; and a layer of anti-ferromagnetic material exchange coupled with the second magnetic pinned layer.

The sensor can be formed by a process that includes, depositing a first sensor stack portion that includes: a magnetic free layer; a non-magnetic layer deposited over the magnetic free layer; and a first portion of a first magnetic pinned layer deposited over the non-magnetic layer. The track-width and back edge of the first sensor stack portion are then defined. A second sensor stack portion is then deposited over the first sensor stack portion. The second sensor stack portion includes: a second portion of the first magnetic pinned layer; a non-magnetic anti-parallel coupling layer deposited over the second portion of the first magnetic pinned layer; a second magnetic pinned layer deposited over the non-magnetic anti-parallel coupling layer; and a layer of antiferromagnetic material deposited over the second magnetic pinned layer.

Because the functional track-width and stripe height of the sensor are patterned and defined on the first sensor portion, smaller dimensions and finer resolution of sensor can be achieved than would be possible if the entire sensor stack were to be patterned. This improves sensor dimension resolution and allows for decreased track-width for increased data density.

In addition, a portion the antiferromagnetic material can be removed near the air bearing surface and the resulting space refilled with a magnetic material that can be stitched to an upper magnetic shield. This removes the thickness of the antiferromagnetic material from the total gap thickness thereby resulting in substantially reduced magnetic spacing.

These and other features and advantages of the invention will be apparent upon reading of the following detailed description of preferred embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
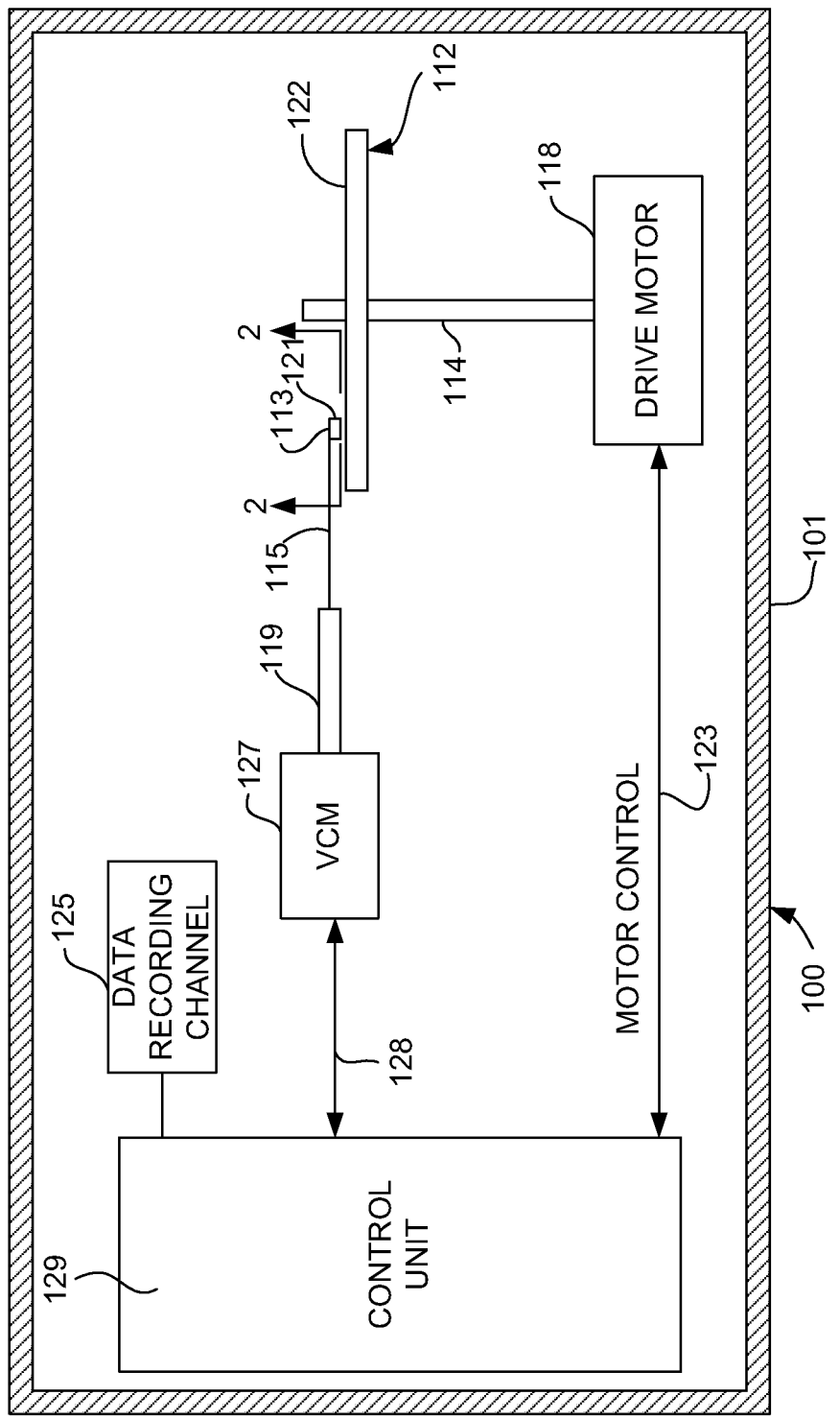
FIG. 1 is a is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118, all of which are mounted within a housing 101. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
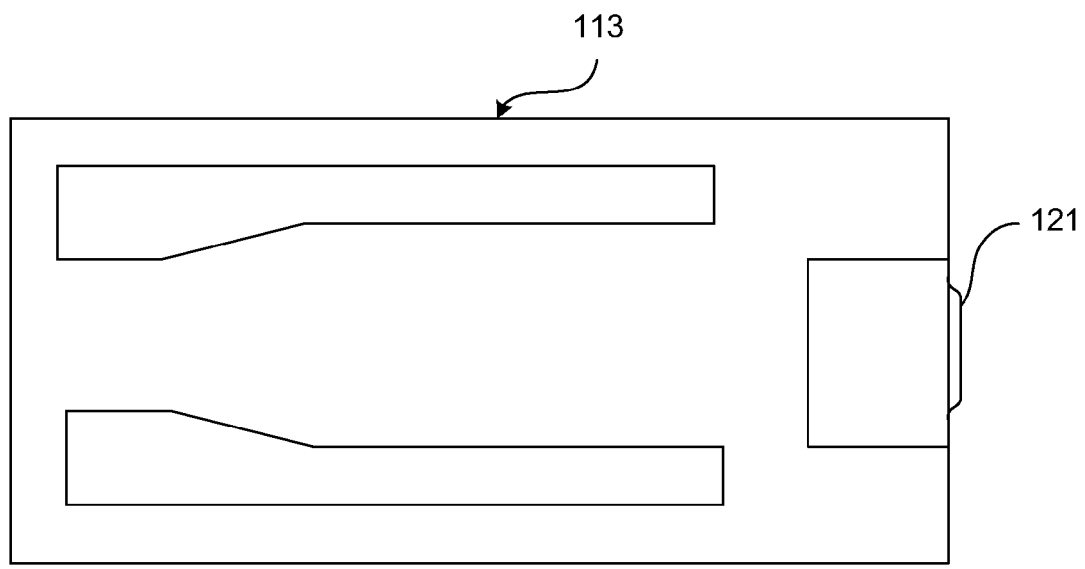
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

Figure 3:
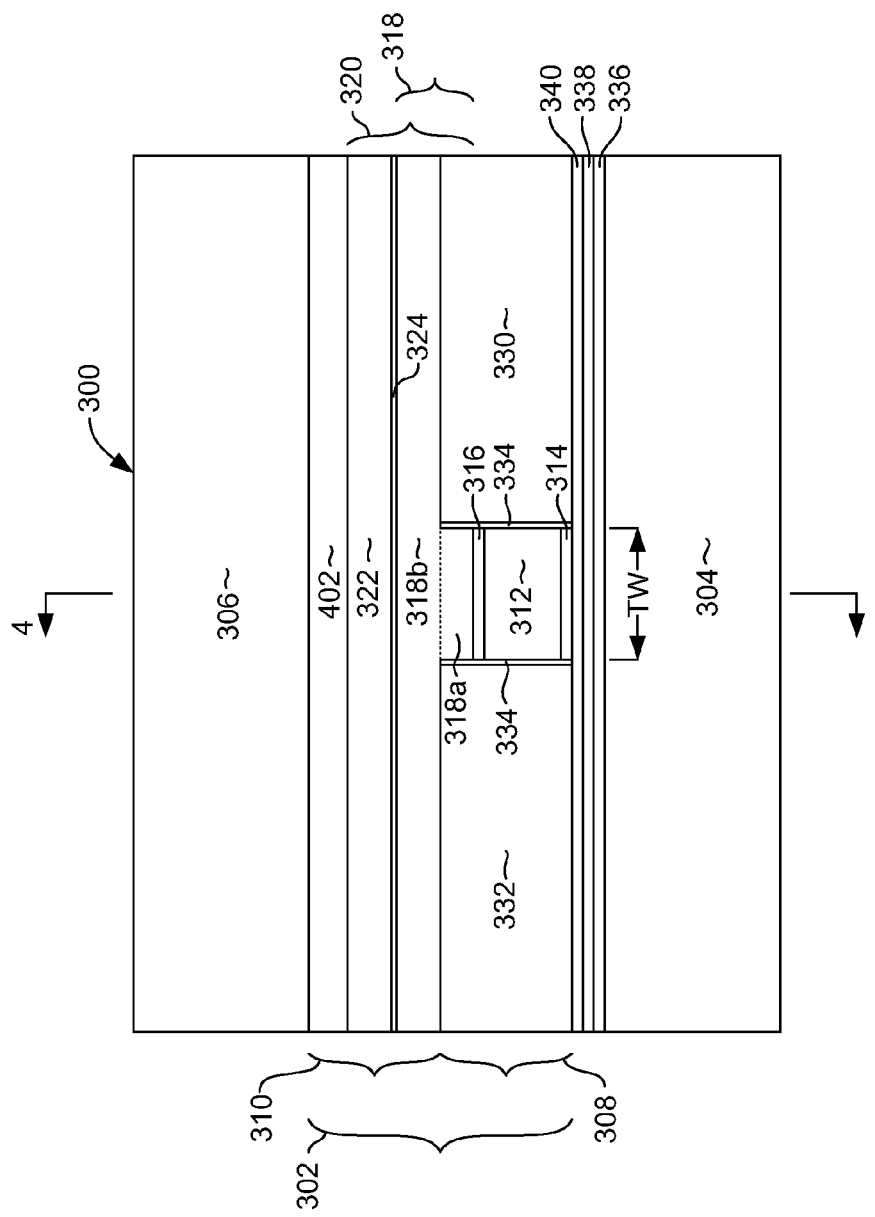
FIG. 3 is an ABS view of a magnetic read sensor as might be formed on a slider of a magnetic data recording system.
Figure 4:
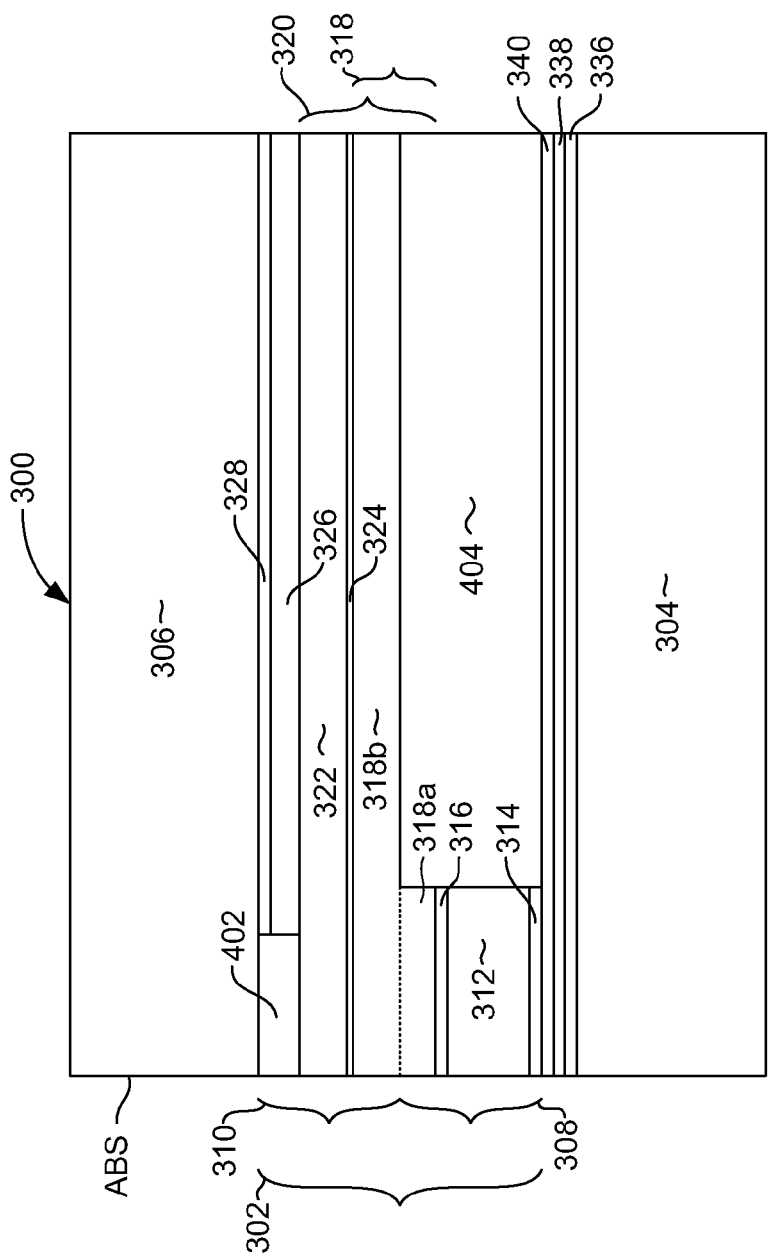
FIG. 4 is side, cross sectional view of the magnetic sensor of FIG. 3 as seen from line 4-4 of FIG. 3.

FIGS. 3 and 4 show a schematic view of a magnetic read head 300. FIG. 3 is a view of the sensor 300 as seen from the air bearing surface (ABS), and FIG. 4 is a side cross sectional view as seen from line 4-4 of FIG. 3. The magnetic read head 300 includes a sensor stack 302 that is sandwiched between upper and lower magnetic shields 304, 306 that can be constructed of an electrically conductive, magnetic material such as NiFe so that they can function as electrical leads as well as magnetic shields.

The sensor stack 302 includes a first sensor stack portion (lower portion) 308 and a second sensor stack portion (upper portion) 310. As shown in FIG. 3, the lower portion 308 has a width that defines a sensor track-width TW, whereas the upper portion 310 can be much wider.

The lower sensor portion 308 can include a magnetic free layer 312 that can be formed on a seed layer 314. The magnetic free layer 312 can include materials such as NiFe, CoFe and/or a Heusler alloy. A non-magnetic spacer or barrier layer 316 can be formed over the magnetic free layer 312. The non-magnetic spacer layer 316 can be a magnetically insulating material such as MgO, if the sensor 300 is a tunnel junction sensor or can be an electrically conductive spacer layer such as AgSn if the sensor 300 is a giant magnetoresistive (GMR) sensor. The lower sensor portion 308 also includes a first portion of a first magnetic pinned layer (AP1 first portion) 318a, which can be constructed of a magnetic material such as NiFe or CoFe. The layer 318a will be discussed in greater detail herein below.

The sensor stack 302 includes a pinned layer structure 320 that include a first pinned magnetic layer (AP1) 318 and second pinned magnetic layer 322 and an antiparallel coupling layer 324 sandwiched between the AP1 layer 318 and AP2 layer 322. The antiparallel coupling layer 324 can be formed of a material such as Ru. As seen in FIG. 3, the AP1 layer 318 is formed as two magnetic layers, a first layer 318a and a second layer 318b. The first layer 318a is part of the lower sensor stack portion 308, while the second layer 318b is part of the upper sensor stack portion 310. Also, it can be seen that the first layer 318a has a width that is within the track-width TW, whereas the second layer 318b extends laterally beyond the track-width TW. A method for manufacturing such pinned layer structure 320 with the novel bi-layer AP1 layer 318 will be described in greater detail herein below. Both the AP1 and AP2 layers can be constructed of one or more magnetic materials such as CoFe, NiFe or combinations of these.

With reference to FIG. 4, the upper sensor stack portion 310 includes layer of antiferromagnetic material AFM layer 326 that is formed over the pinned layer structure 320, opposite the free layer 312. As seen in FIG. 4, the AFM layer 326 is recessed from the ABS, and a magnetic pedestal 402 is disposed between the AFM layer 326 and the ABS and also between the AP2 layer 322 and the upper shield 306. The AFM layer 326 can be a material such as IrMn or PtMn and is exchange coupled with the AP2 layer 322. The exchange coupling between the AFM layer 326 and the AP2 layer 322 pins the magnetization of the AP2 layer in a direction that is perpendicular to the ABS. The antiparallel coupling between the AP1 layer 318 and AP2 layer 322 pins the magnetization of the AP1 layer 318 in a direction that is also perpendicular to the ABS and that is opposite to that of the AP2 layer 322. A capping layer 328 can be formed over the AFM layer 326 to protect the underlying layers during manufacture and to magnetically decouple the sensor stack 302 from the upper shield 306. The space behind the first sensor stack portion 308 can be filled with a non-magnetic, electrically insulating fill layer such as alumina 404.

The magnetic pedestal 402 can be constructed of a material similar to that of the upper shield 306, such as NiFe. The magnetic pedestal 402 can be magnetically coupled with the magnetic shield 306 so that it functions as part of the magnetic shield. As a result, the AFM layer 326 and capping layer 328 advantageously do not contribute to the read gap, resulting in increased data density. Therefore, the read gap G is the distance between the top of the lower shield 304 and the bottom of the pedestal 402 as shown FIG. 4.

With reference again to FIG. 3, the sensor 300 can include magnetic bias layers 330, 332 at either side of the sensor stack 302. The bias layers 330, 332 provide a magnetic bias field that biases the magnetization of the magnetic free layer 312 in a direction parallel with the air bearing surface (ABS). The bias layers 330, 332 can be separated from the sensor stack 302 and bottom shield by a thin, non-magnetic, electrically insulating material such as alumina 334. The magnetic bias structures 330, 332 can be constructed of a high coercivity, hard magnetic material that keeps its magnetization as a result of its intrinsic hard magnetic properties. Alternatively, the bias layers 330, 332 can be constructed of a soft magnetic material. In that case, the magnetization of the bias structure can be maintained by an exchange coupled layer of antiferromagnetic material formed there-under. For example, a layer of nonmagnetic material such as Ru 336, a layer of antiferromagnetic material such as IrMn 338 formed over the nonmagnetic material 336 and a magnetic layer 340 formed over the layer of antiferromagnetic material 338. The non-magnetic layer 336 magnetically decouples the layer 338 from the bottom shield 304. The antiferromagnetic layer 338 is exchange coupled with the magnetic layer 340 to pin its magnetization. This pinned magnetization of the layer 340 then maintains the magnetization of the bias layers 330, 332 in a desired direction parallel with the air bearing surface.

Figure 5:
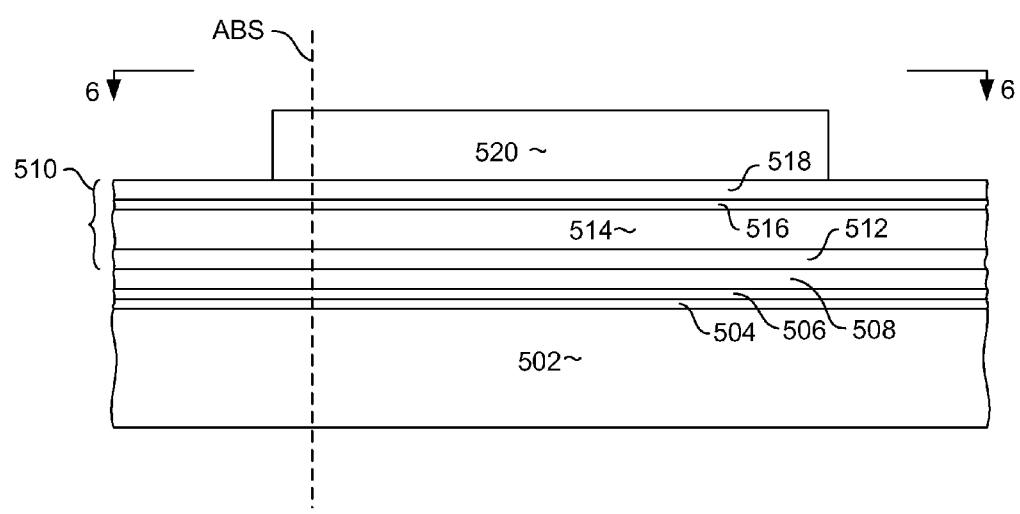
FIGS. 5-25 are views of a magnetic sensor in various intermediate stages of manufacture, illustrating a method of manufacturing a magnetic sensor according to an embodiment of the invention.

FIGS. 5-25 illustrate a method for manufacturing a magnetic sensor such as the sensor 300, and further illustrate the advantages provided by such a sensor structure. With particular reference to FIG. 5, a bottom magnetic shield 502 is formed of a material such as NiFe. Then, an optional series of layers can be deposited to maintain magnetization of a yet to be formed bias structure. These layers can include: a non-magnetic decoupling layer such as Ru 504 deposited onto the bottom shield; a layer of antiferromagnetic material 506 deposited over the decoupling layer 504; and a layer of magnetic material such as NiFe 508 deposited over the layer of antiferromagnetic material 506.

After depositing the optional layers 504, 506, 508, a first series of sensor layers 510 is deposited. This first series of sensor layers 510 can correspond to the bottom sensor stack portion 308 described above with reference to FIG. 3. The first series of sensor layers 510 can include: a seed layer 512; a magnetic free layer 514 formed over the seed layer 512, a non-magnetic barrier or spacer layer 516 deposited over the magnetic free layer 514 and a first portion of a magnetic first pinned layer (first portion of an AP1 layer) 518 formed over the non-magnetic spacer or barrier layer 516.

Figure 6:
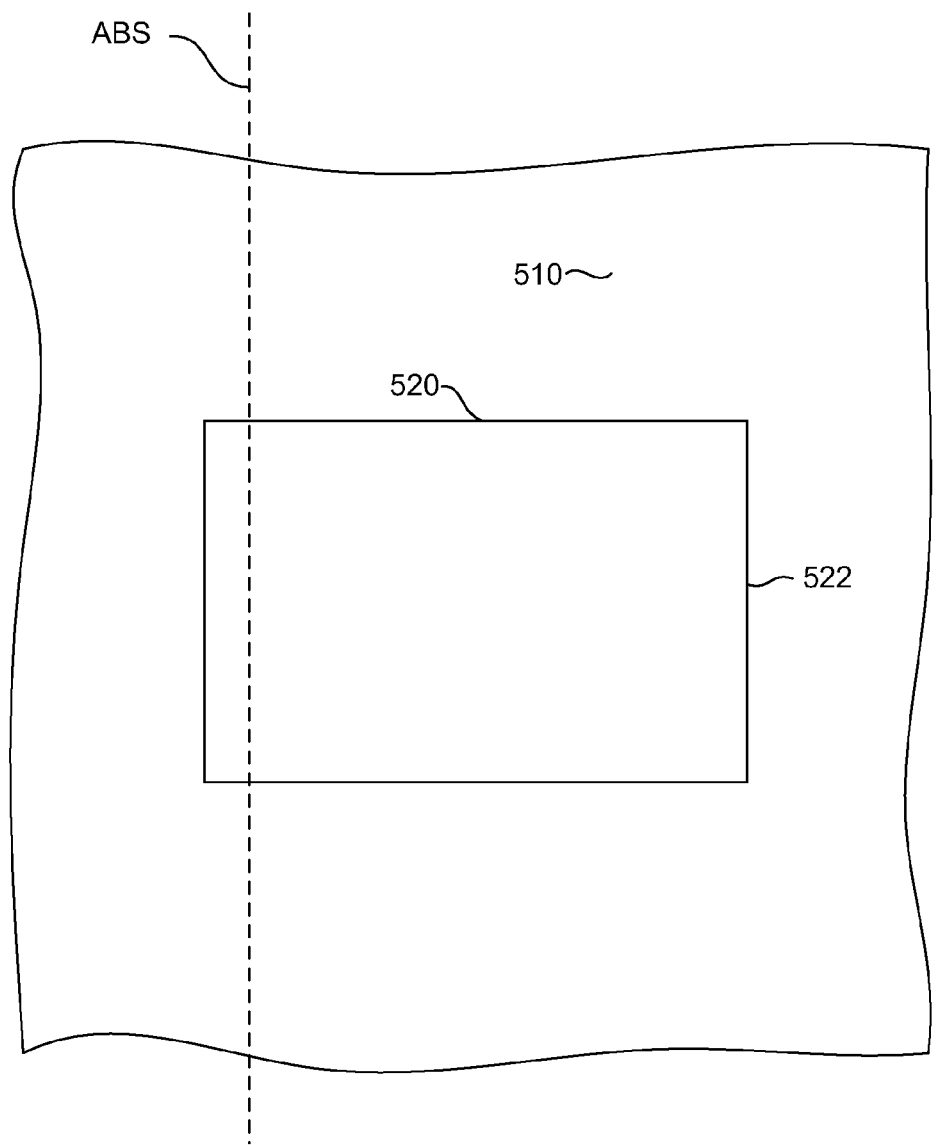

Then, a first mask structure 520 is formed over the first series of sensor layers. The configuration of the mask 520 can be better understood with reference to FIG. 6 which shows a top down view as seen from line 6-6 of FIG. 5. As can be seen in FIG. 6 the mask 520 extends over an air bearing surface plane denoted ABS and extends to a back edge 522 that is configured to define a lower sensor stack stripe height.

Figure 7:
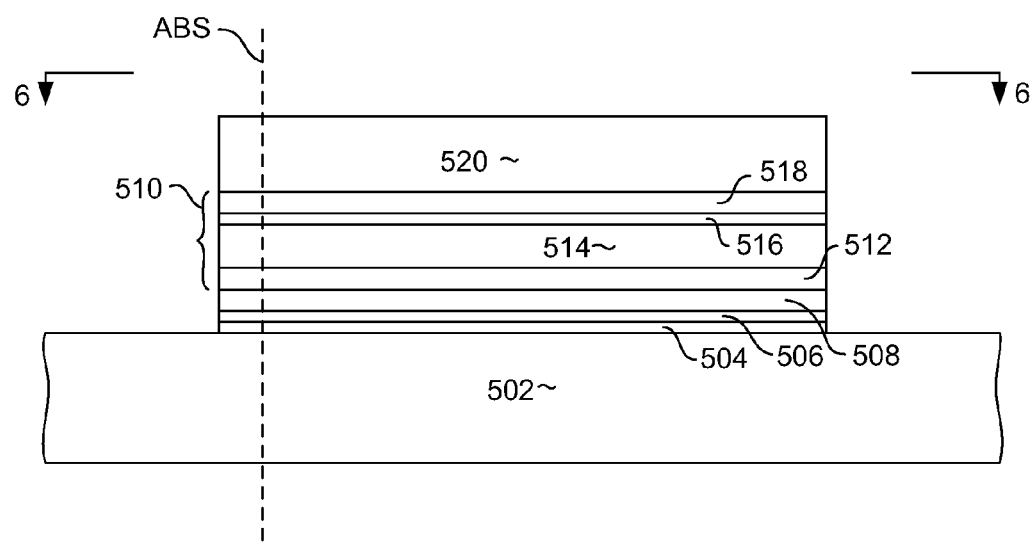
Figure 8:
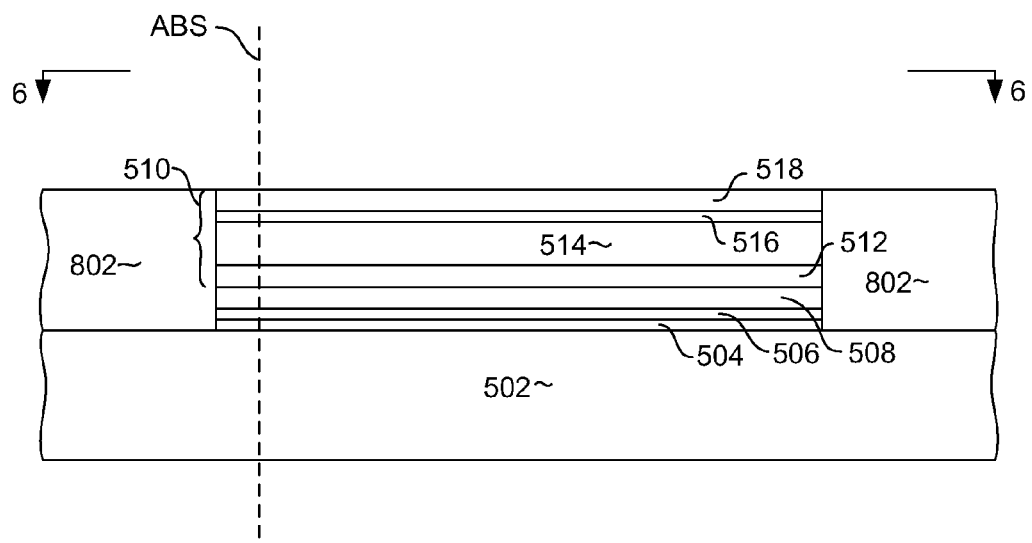

With reference now to FIG. 7, a first ion milling is performed to remove layers not protected by the mask 520. The ion milling can be performed until the bottom shield 502 has been reached. Then, a non-magnetic, electrically insulating fill layer such as alumina 802 is deposited and a planarization process performed, leaving a structure as shown in FIG. 8. The planarization can include performing a chemical mechanical polishing and may include a mask liftoff process.

As can be seen from the above, the masking and milling process that defines the track-width TW is performed on a much thinner structure (the series of sensor layers 510) than would be the case if rest of the pinned layer structure and antiferromagnetic pinning layer were to be included. This advantageously allows the masking and ion milling to define a much smaller track with than would otherwise be possible.

Figure 9:
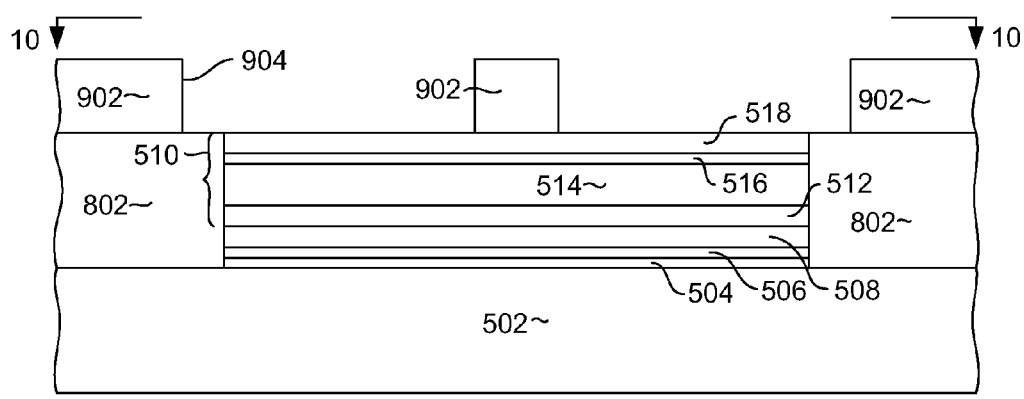
Figure 10:
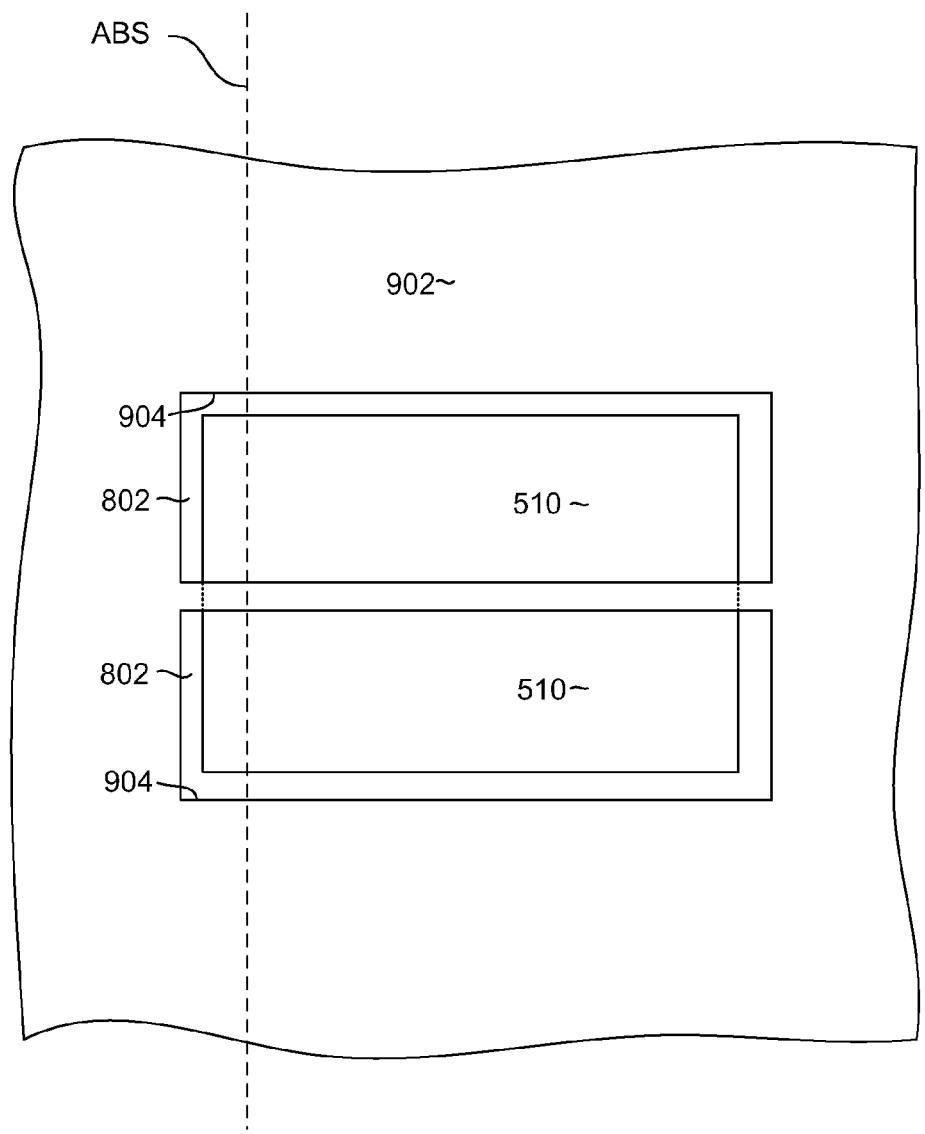
Figure 11:
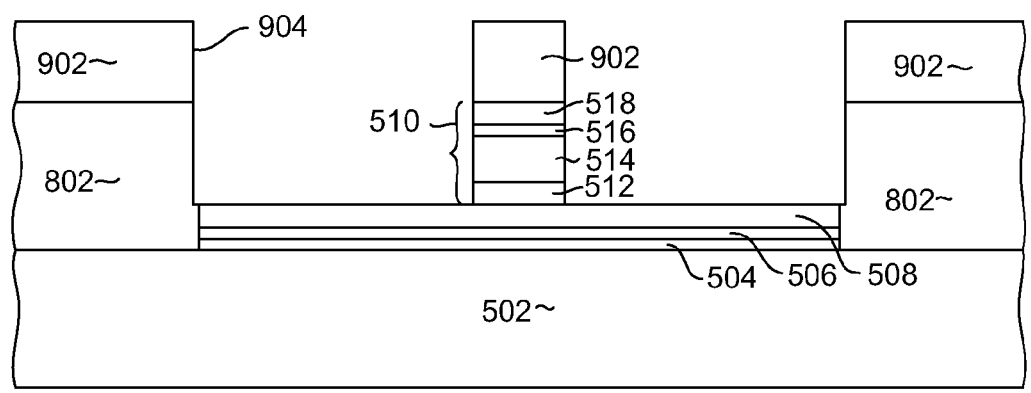
Figure 12:
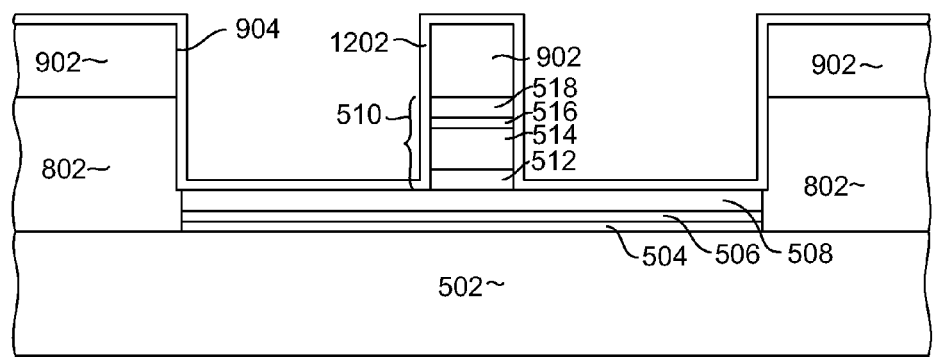

With reference now to FIGS. 9 and 10, a second mask structure 902 is formed. FIG. 10 is a top down view as seen from line 10-10 of FIG. 9. The mask 902 has an opening 904 that is configured to define a stripe height of a lower sensor stack portion. Then, with reference to FIG. 11, a second ion milling is performed to remove material not protected by the mask 902. This ion milling can be terminated prior to removal of layers 504, 506, 508 as shown in FIG. 11. With reference to FIG. 12, a thin, nonmagnetic, electrically insulating layer 1202 is deposited. The layer 1202 can be a material such as SiN and is preferably deposited by a conformal deposition process such as atomic layer deposition or ion beam deposition.

Figure 13:
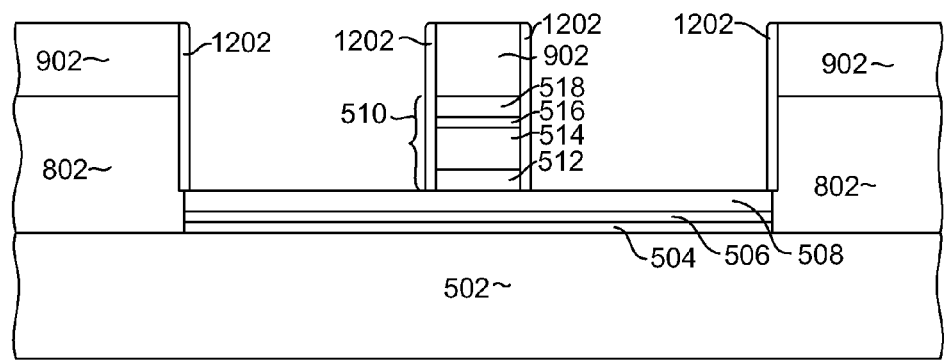
Figure 14:
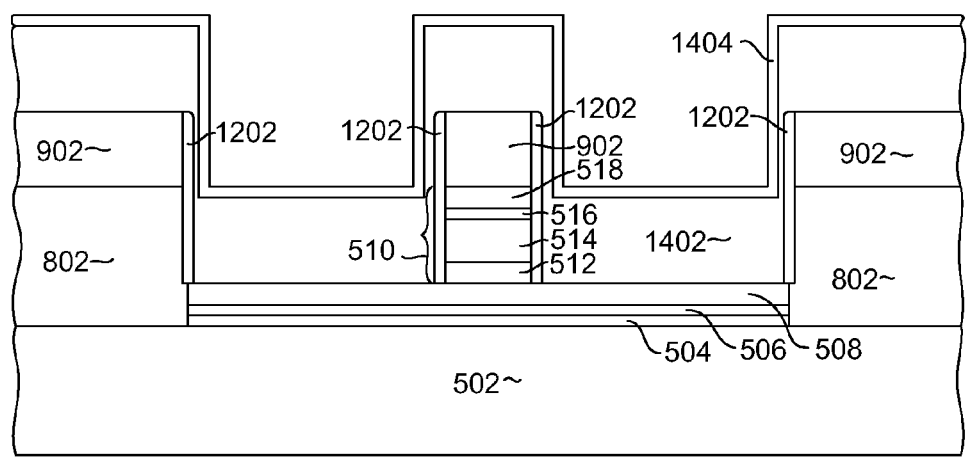
Figure 15:
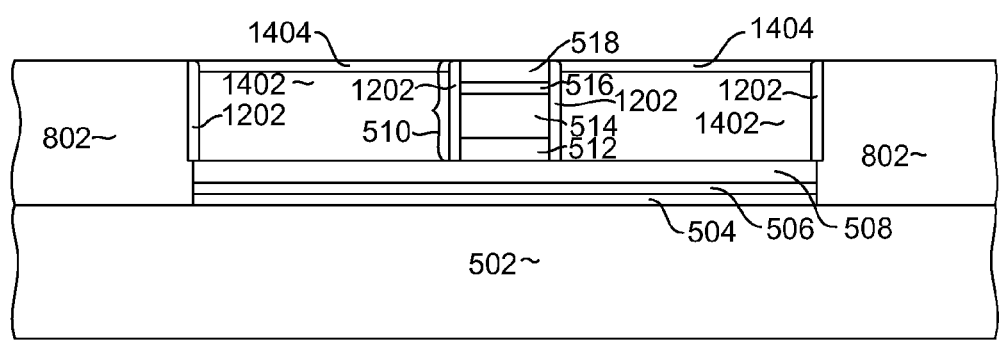

Then, with reference to FIG. 13, a directional material removal process such as ion milling is performed in such a manner to remove horizontally disposed portions of the insulation layer 1202 leaving vertical insulation side walls as shown in FIG. 13. Then, with reference to FIG. 14, a magnetic bias material 1402 is deposited followed by a CMP stop layer/bias capping layer 1404. The bias material 1402 can be NiFe and the capping layer can be carbon or diamond like carbon. The insulation side walls 1202 passivate the sensor layers 510, while leaving the magnetic layer 508 exposed to exchange couple with the magnetic bias layer 1402. Then, a chemical mechanical polishing (CMP) can be performed to planarize the structure and remove the second mask 902, leaving a structure as shown in FIG. 15.

Figure 16:
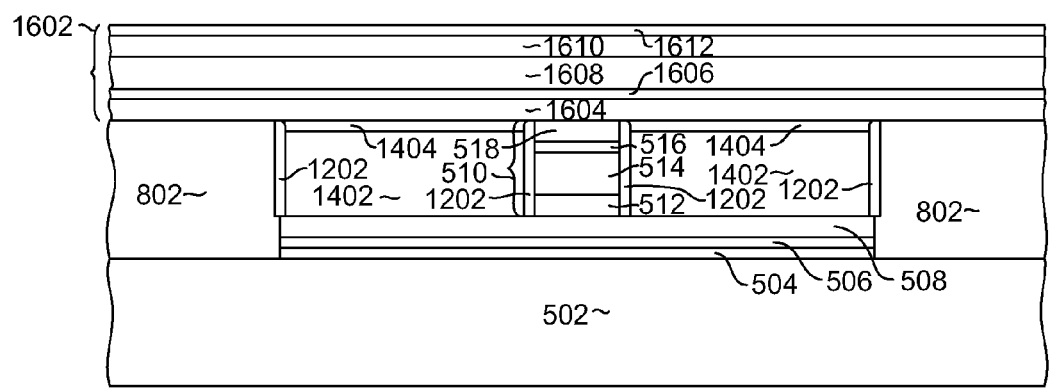

With reference now to FIG. 16, a glancing angle mill, such as at an angle of 50 degrees-75 degrees is performed to expose layer 518 then a second series of sensor layers 1602 is deposited. These layers 1602 can correspond with the upper sensor stack portion 310 described above with reference to FIGS. 3 and 4. The series of sensor layers include a magnetic layer 1604 that forms a second portion of the AP1 layer. An anti-parallel coupling layer such as Ru 1606 is deposited over the magnetic layer 1604. Another magnetic layer (AP2) layer 1608 is deposited over the anti-parallel coupling layer 1606. A layer of antiferromagnetic material (AFM layer) such as IrMn or PtMn 1610 is deposited over the AP2 layer 1608, and a capping layer 1612 is deposited over the AFM layer 1610. The capping layer can include one or more of Ta and Ru.

Figure 17:
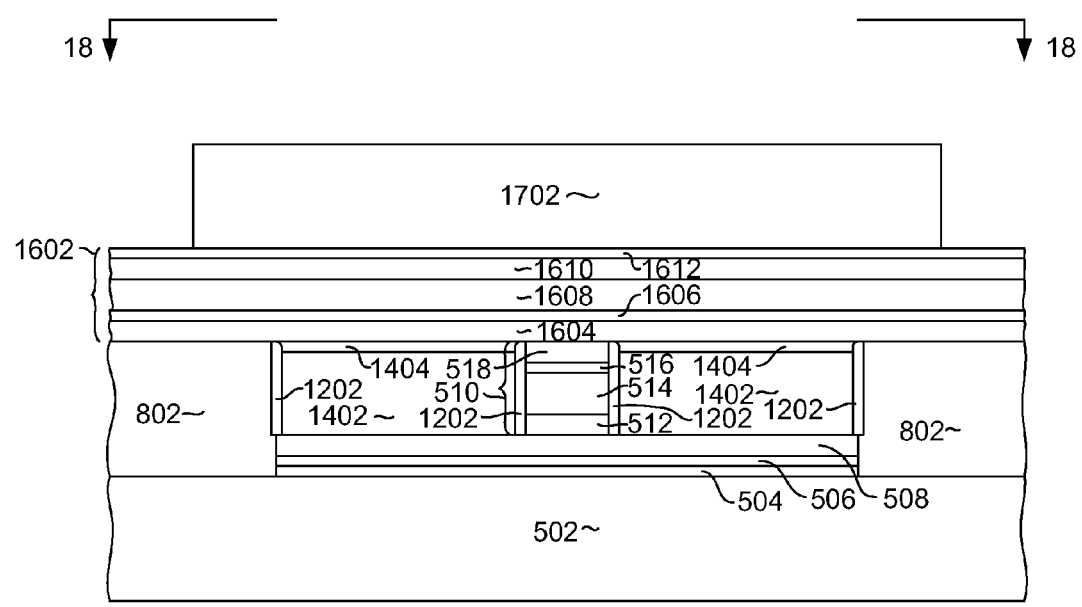
Figure 18:
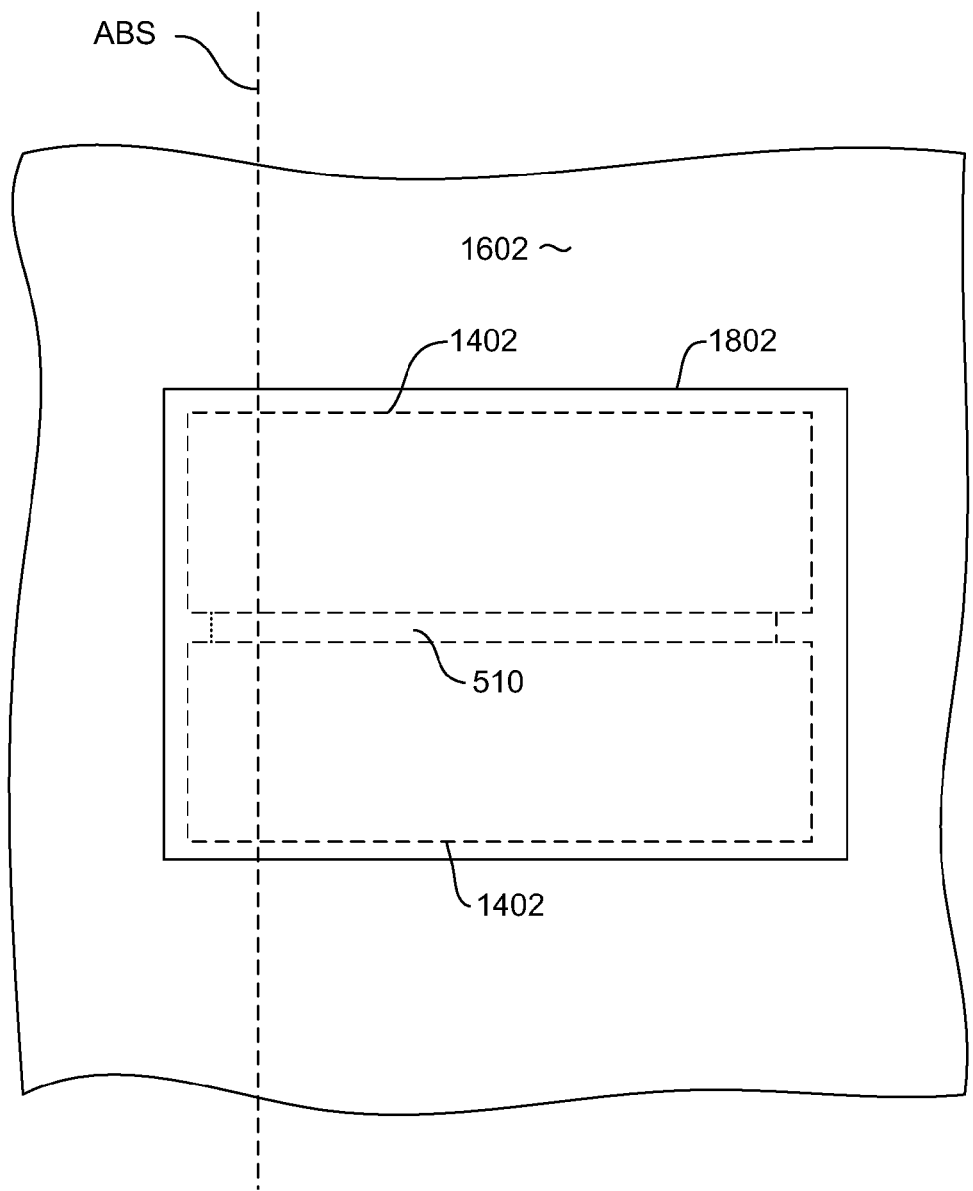
Figure 19:
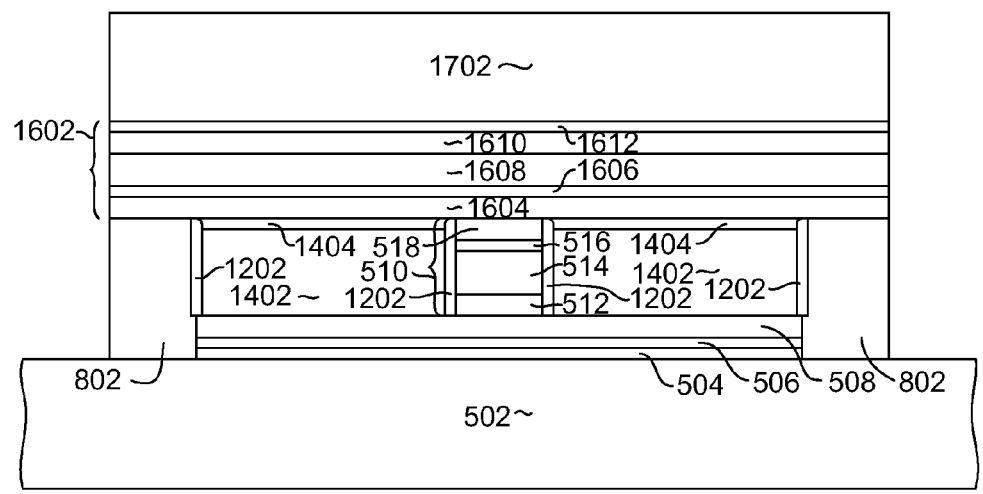
Figure 20:
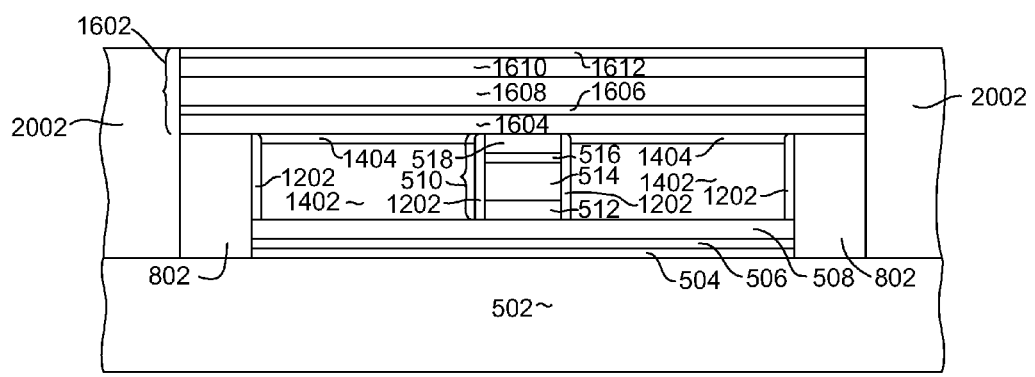

Then, with reference to FIG. 17, a third mask structure 1702 is formed over the second series of sensor layers 1602. The configuration of the mask 1702 can be seen more clearly with reference to FIG. 18, which shows a top-down view as seen from line 18-18 of FIG. 17. The mask 1702 defines the outer boundaries (stripe height and width) of the second series of sensor layers 1602. Then, with reference to FIG. 19, a third ion milling is performed to remove material not protected by the third mask 1702. The third ion milling can be performed until the bottom shield 502 has been reached. Then, an electrically insulating, nonmagnetic fill layer 2002 is deposited and a planarization process such as chemical mechanical polishing is performed, leaving a structure as shown in FIG. 20.

Figure 21:
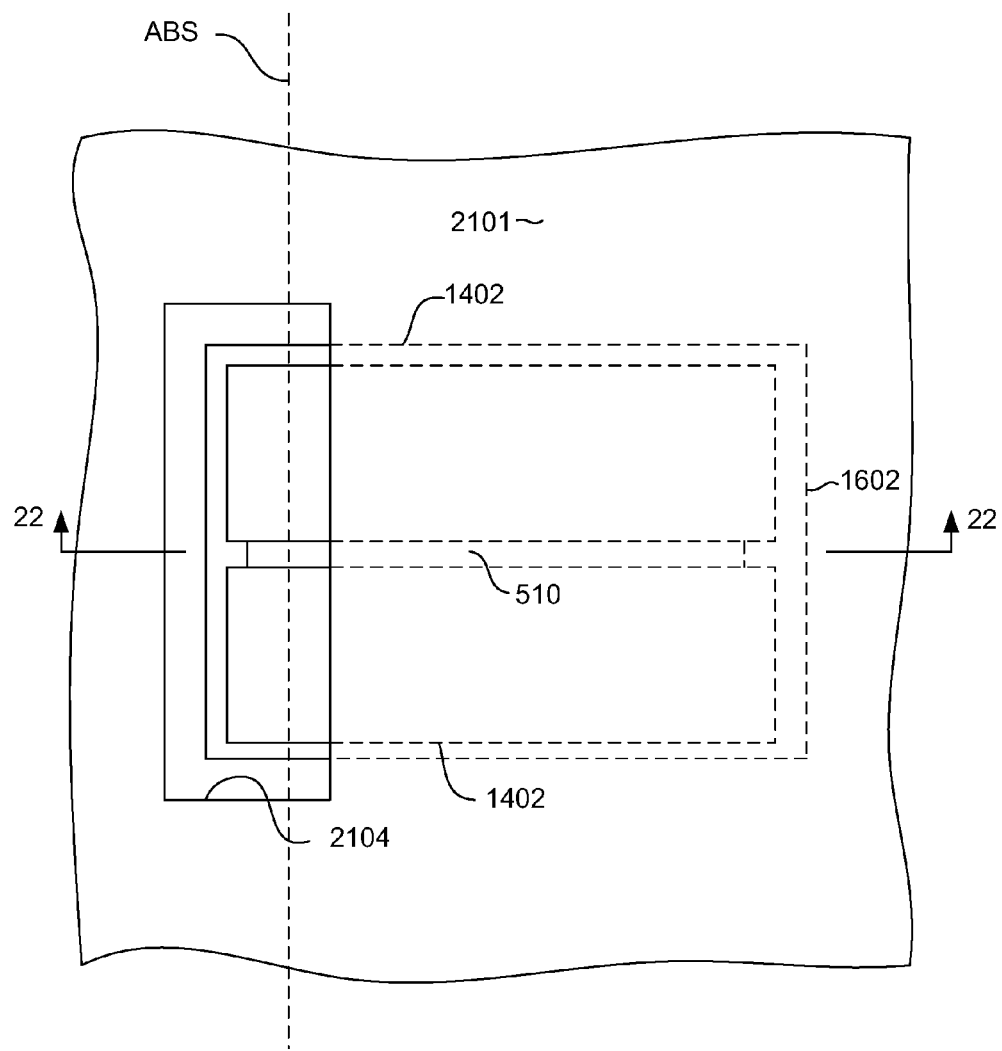
Figure 22:
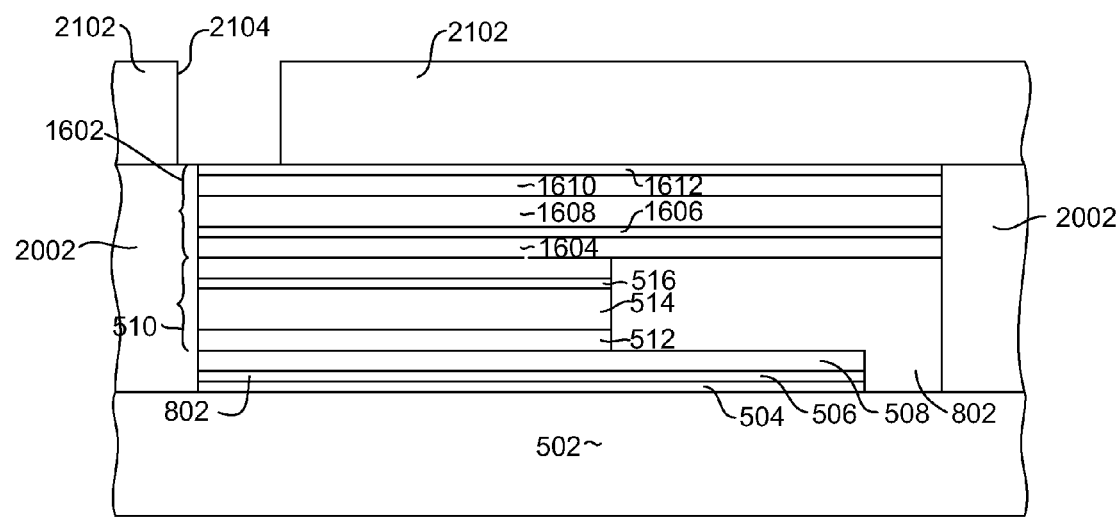
Figure 23:
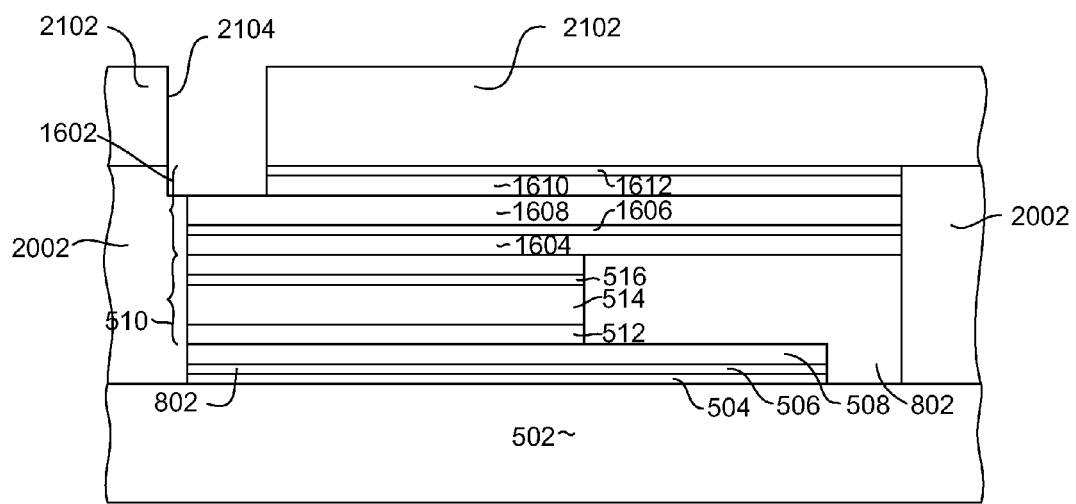
Figure 24:
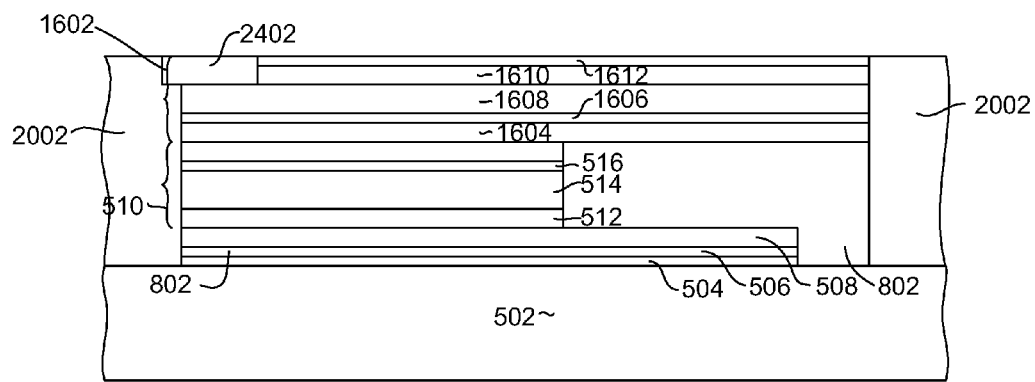
Figure 25:
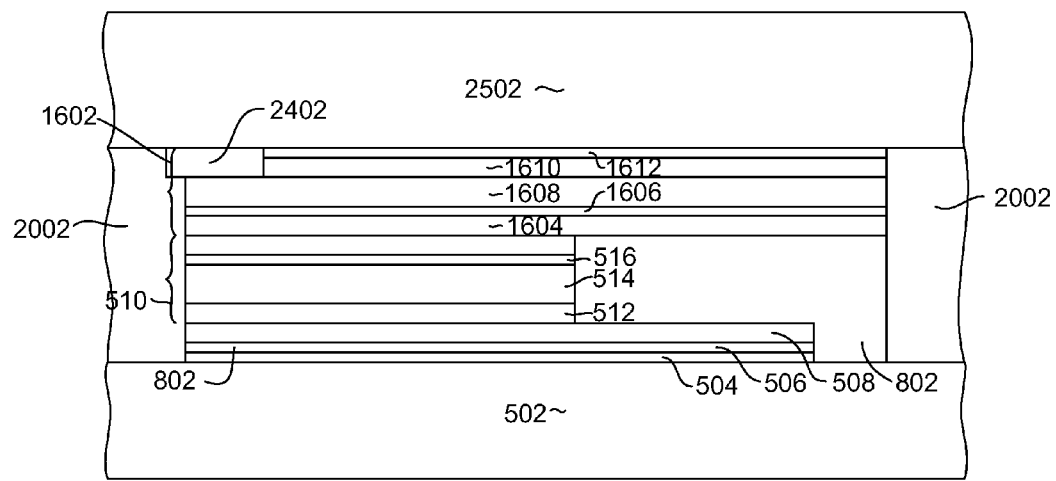

With reference now to FIGS. 21 and 22, a fourth mask structure 2101 is formed having an opening 2104 located in a region at the air bearing surface. FIG. 22 is a side cross sectional view as seen from line 22-22 of FIG. 21. With reference to FIG. 23, an ion milling is performed just sufficiently to remove portions of the capping layer 1612 and AFM layer 1610 that are not protected by the mask 2102, stopping at the AP2 layer 1608. Then, a magnetic material 2402 is deposited and a planarization process such as chemical mechanical polishing is performed, leaving a structure as shown in FIG. 24 with the magnetic material 2402 forming a pedestal. Then, with reference to FIG. 25, an upper magnetic shield 2502 is formed, such as by electroplating. The upper magnetic shield 2502 is stitched to and magnetically connected with the magnetic pedestal. 2402.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic sensor, comprising:
    a sensor stack having a first portion and a second portion formed over the first portion, the first portion having a width that defines a sensor track-width and the second portion having a width that extends beyond the sensor track-width; wherein
    the first portion of the sensor stack includes: a magnetic free layer; a non-magnetic layer; and a first portion of a first magnetic pinned layer, the non-magnetic layer being sandwiched between the magnetic free layer and the first portion of the first magnetic pinned layer; and
    the second portion of the sensor stack includes: a second portion of the first magnetic pinned layer; a second magnetic pinned layer; a non-magnetic anti-parallel coupling layer sandwiched between the first magnetic pinned layer and the second magnetic pinned layer; and a layer of anti-ferromagnetic material exchange coupled with the second magnetic pinned layer.

2. The magnetic sensor as in claim 1, wherein:
    the sensor stack extends to an air bearing surface;
    the first portion of the magnetic sensor stack has a back edge opposite the air bearing surface, the distance between the back edge and the air bearing surface defining a sensor stripe height; and
    the second portion extends beyond the sensor stripe height.

3. The magnetic sensor as in claim 1, wherein the sensor stack extends to an air bearing surface and the layer of anti-ferromagnetic material is recessed from the air bearing surface.

4. The magnetic sensor as in claim 3, wherein the sensor stack is located between first and second magnetic shields, and further comprising a magnetic pedestal located between the layer of anti-ferromagnetic material and the air bearing surface.

5. The magnetic sensor as in claim 4, wherein the magnetic pedestal is magnetically connected with the second magnetic shield.

6. The magnetic sensor as in claim 1 wherein the second portion of the sensor stack is located in a trailing direction relative to the first portion of the sensor stack.

7. The magnetic sensor as in claim 1 wherein the layer of anti-ferromagnetic material is formed over the second magnetic pinned layer opposite the magnetic free layer.

8. The magnetic sensor as in claim 1, further comprising first and second magnetic bias structures formed adjacent to each of the first and second sides of the first portion of the sensor stack, the magnetic bias structures being formed of a magnetically soft material.

9. The magnetic sensor as in claim 8, wherein each of the magnetic bias structures is exchange coupled with a layer of anti-ferromagnetic material.

10. The magnetic sensor as in claim 8, wherein each of the magnetic bias structures is exchange coupled with a layer of anti-ferromagnetic material that extends beneath the first portion of the sensor stack and beneath each of the magnetic bias structures.

11. A magnetic data recording system, comprising:
    a housing:
    a magnetic media moveably mounted within the housing;
    a magnetic head having a magnetic sensor formed thereon; and
    an actuator mechanism for moving the magnetic head relative to a surface of the magnetic media,
    wherein the magnetic sensor further comprises:
    a sensor stack having a first portion and a second portion formed over the first portion, the first portion having a width that defines a sensor track-width and the second portion having a width that extends beyond the sensor track-width; wherein
    the first portion of the sensor stack includes: a magnetic free layer; a non-magnetic layer; and a first portion of a first magnetic pinned layer, the non-magnetic layer being sandwiched between the magnetic free layer and the first portion of the first magnetic pinned layer; and
    the second portion of the sensor stack includes: a second portion of the first magnetic pinned layer; a second magnetic pinned layer; a non-magnetic anti-parallel coupling layer sandwiched between the first magnetic pinned layer and the second magnetic pinned layer; and a layer of anti-ferromagnetic material exchange coupled with the second magnetic pinned layer.

12. The magnetic data recording system as in claim 11, wherein:
    the sensor stack extends to an air bearing surface;
    the first portion of the magnetic sensor stack has a back edge opposite the air bearing surface, the distance between the back edge and the air bearing surface defining a sensor stripe height; and
    the second portion extends beyond the sensor stripe height.

13. The magnetic data recording system as in claim 11, wherein the sensor stack extends to an air bearing surface and the layer of anti-ferromagnetic material is recessed from the air bearing surface.

14. The magnetic data recording system as in claim 13, wherein the sensor stack is located between first and second magnetic shields, and further comprising a magnetic pedestal located between the layer of anti-ferromagnetic material and the air bearing surface.

* * * * *